(12) United States Patent
Takahata et al.

(10) Patent No.: US 9,437,465 B2
(45) Date of Patent: Sep. 6, 2016

(54) SUBSTRATE PROCESSING APPARATUS AND METHOD OF MANUFACTURING SEMICONDUCTOR DEVICE

(75) Inventors: Satoru Takahata, Imizu (JP); Yukio Ozaki, Toyama (JP); Reizo Nunozawa, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 12/631,152

(22) Filed: Dec. 4, 2009

(65) Prior Publication Data

US 2010/0144145 A1 Jun. 10, 2010

(30) Foreign Application Priority Data

Dec. 10, 2008 (JP) ................................. 2008-313854

(51) Int. Cl.
| | | |
|---|---|---|
| H01L 21/203 | (2006.01) | |
| H01L 21/67 | (2006.01) | |
| C23C 16/52 | (2006.01) | |
| C23C 16/54 | (2006.01) | |
| G05B 19/4063 | (2006.01) | |
| G05B 19/418 | (2006.01) | |

(52) U.S. Cl.
CPC ......... *H01L 21/67276* (2013.01); *C23C 16/52* (2013.01); *C23C 16/54* (2013.01); *G05B 19/4063* (2013.01); *G05B 19/41875* (2013.01); *G05B 2219/31437* (2013.01); *G05B 2219/45031* (2013.01); *Y02P 90/18* (2015.11); *Y02P 90/20* (2015.11); *Y02P 90/22* (2015.11)

(58) Field of Classification Search
USPC .................... 118/696, 699, 702, 704; 427/70
See application file for complete search history.

(56) References Cited

U.S. PATENT DOCUMENTS

| | | | | |
|---|---|---|---|---|
| 6,162,010 | A * | 12/2000 | Ishizawa | C23C 16/54 414/217 |
| 6,589,593 | B1 * | 7/2003 | Hupe et al. | 205/125 |
| 2002/0078976 | A1 * | 6/2002 | Nguyen | H01L 21/67046 134/6 |
| 2002/0116076 | A1 * | 8/2002 | Yoshimoto et al. | 700/2 |
| 2003/0019840 | A1 * | 1/2003 | Smith, Jr. | G01J 3/28 216/60 |
| 2005/0233477 | A1 * | 10/2005 | Yamazaki | H01J 37/32935 438/5 |

(Continued)

FOREIGN PATENT DOCUMENTS

| | | |
|---|---|---|
| JP | 832280 | 2/1996 |
| JP | 9-319622 | 12/1997 |

(Continued)

OTHER PUBLICATIONS

Abstract of 10-20060085176 corresponds to 10-0773023.

*Primary Examiner* — Charles Capozzi
(74) *Attorney, Agent, or Firm* — Brundidge & Stanger, P.C.

(57) ABSTRACT

When a step is delayed, an operator can be rapidly informed of the delay. A substrate processing apparatus comprises a process system configured to process a substrate; a control unit configured to control the process system for performing a plurality of steps; and a manipulation unit configured to monitor a progress of each of the plurality of steps, wherein when a time elapsed after the control unit goes into a hold state exceeds an allowable time previously allocated to the one of the plurality of steps while waiting for a completion of the one of the plurality of steps started by the process system, the control unit transmits an alarm message to the manipulation unit so as to inform the manipulation unit that the allowable time is exceeded, terminates the hold state, and performs a recovery action.

17 Claims, 11 Drawing Sheets

(56) References Cited

U.S. PATENT DOCUMENTS

| | | | |
|---|---|---|---|
| 2006/0164591 A1* | 7/2006 | Hiruma | 349/191 |
| 2009/0292374 A1 | 11/2009 | Iwakura | |

FOREIGN PATENT DOCUMENTS

| | | | | |
|---|---|---|---|---|
| JP | 10-91234 | 4/1998 | | |
| JP | 10178082 | 6/1998 | | |
| JP | 2001-291650 | 10/2001 | | |
| JP | 2005045131 | 2/2005 | | |
| JP | 2008225987 | 9/2008 | | |
| JP | 2008227029 | 9/2008 | | |
| KR | 2004040625 A | * | 5/2004 | H01L 21/027 |
| KR | 20040040625 | | 5/2004 | |
| KR | 2004087528 A | * | 10/2004 | H01L 21/28 |
| KR | 20060125997 | | 12/2006 | |
| KR | 100773023 | | 11/2007 | |
| TW | 592889 | | 6/2004 | |
| TW | 200741804 | | 11/2007 | |

* cited by examiner

Fig. 8

| STEPS | ALLOWABLE TIME(t2) | RECOVERY ACTIONS |
|---|---|---|
| Boat Loading | 00:20:00 | BUZZER<br>END<br>SYSTEM<br>RESET<br>JUMP |
| Slow Vac. Leakage Check | 01:00:00 | BUZZER<br>END<br>SYSTEM<br>RESET<br>JUMP |
| DEPO | 03:00:00 | ... |
| Purge | 00:40:00 | ... |
| Boat Unloading | 00:40:00 | BUZZER<br>END<br>SYSTEM<br>RESET<br>JUMP |

SUBSTRATE PROCESSING APPARATUS AND METHOD OF MANUFACTURING SEMICONDUCTOR DEVICE

CROSS-REFERENCE TO RELATED PATENT APPLICATION

This U.S. non-provisional patent application claims priority under 35 U.S.C. §119 of Japanese Patent Application No. 2008-313854, filed on Dec. 10, 2008, in the Japanese Patent Office, the entire contents of which are hereby incorporated by reference.

BACKGROUND OF THE INVENTION

1. Field of the Invention

The present invention relates to a substrate processing apparatus configured to perform a plurality of steps sequentially and a method of manufacturing a semiconductor device.

2. Description of the Prior Art

As one of processes included in a method of manufacturing a semiconductor device such as an integrated circuit (IC) or dynamic random access memory (DRAM), there is a substrate processing process which includes sequential steps such as: a step of loading a substrate into a process furnace; a step of increasing the inside temperature of the process furnace to a film-forming temperature; a step of processing the substrate by supplying process gas to the inside of the process furnace; a step of decreasing the inside temperature of the process furnace to a standby temperature; and a step of unloading the processed substrate from the inside of the process furnace.

Such a substrate processing process is performed using a substrate processing apparatus including: a process system including a process furnace configured to process a substrate; a manipulation unit configured to receive instructions input to the process system and display substrate processing states on a manipulation screen; and a control unit configured to control the process system to perform a plurality of steps sequentially.

When a substrate processing process is performed, due to defects or malfunctioning of a substrate processing apparatus, steps of the substrate processing process can be delayed. However, in case of a conventional substrate processing apparatus, it is difficult to enable an operator to perceive a delay of a process step promptly, and thus it may take considerable time to take necessary action such as a recovery action (error handling action). As a result, for example, a substrate may be accidentally left in a high-temperature process furnace for a long time, and thus the substrate may be thermally damaged (causing lot-out).

SUMMARY OF THE INVENTION

An object of the present invention is to provide a substrate processing apparatus capable of rapidly informing an operator of a delay of step when progress of step is delayed due to a certain reason.

Another object of the present invention is to provide a method of manufacturing a semiconductor device using the substrate processing apparatus.

According to an aspect of the present invention, there is provided a substrate processing apparatus comprising: a process system configured to process a substrate; a control unit configured to control the process system for performing a recipe including a plurality of steps; and a manipulation unit configured to monitor a progress of each of the plurality of steps of the recipe, wherein when a time elapsed after the control unit goes into a hold state exceeds an allowable time previously allocated to the one of the plurality of steps while waiting for a completion of the one of the plurality of steps started by the process system, the control unit transmits an alarm message to the manipulation unit so as to inform the manipulation unit that the allowable time is exceeded, terminates the hold state, and performs a recovery action.

According to another aspect of the present invention, there is provided a substrate processing apparatus comprising a control unit configured to perform a recipe comprising a plurality of steps, wherein if a time elapsed from start of any one of the steps exceeds an allowable time previously set for the step, the control unit performs a predetermined error handling action, and then the control unit generates an alarm message for indicating an abnormal end.

According to another aspect of the present invention, there is provided a substrate processing apparatus comprising a manipulation unit configured to display a plurality of steps, in which substrate processing conditions are set in a time-series manner, on a manipulation screen, and to prepare or edit a recipe on the manipulation screen, wherein if a predetermined button is pressed, for each of the steps, the manipulation unit displays a standby monitor screen to indicate a set value of a standby time, a measured value of the standby time, and an item performed in any one of the steps, and during the standby time, the control unit counts up the measured value of the standby time on the standby monitor screen and clearly specifies the item relating to the standby time on the standby monitor screen.

According to another aspect of the present invention, there is provided a method of manufacturing a semiconductor device by performing a recipe constituted by a plurality of steps, the method comprising: loading a substrate holder in which a substrate is held into a process furnace; increasing temperature of the process furnace from a standby temperature to a film-forming temperature; forming a film on the substrate by performing a predetermined process on the substrate; decreasing the temperature of the process furnace from the film-forming temperature to the standby temperature; and unloading the substrate holder from the process furnace, wherein if a time elapsed from start of a step exceeds an allowable time previously allocated to the step, an alarm message is provided so as to report that the allowable time is exceeded.

BRIEF DESCRIPTION OF THE DRAWINGS

FIG. 8 is a schematic view illustrating exemplary error handling actions set in an alarm condition table for each step of a process recipe.

DETAILED DESCRIPTION OF THE PREFERRED EMBODIMENTS (1) Structure of Substrate Processing Apparatus The substrate processing apparatus of the current embodiment is configured, for example, as a semiconductor manufacturing apparatus used to perform a substrate processing process in a method of manufacturing a semiconductor device (e.g., IC or DRAM). In addition, the substrate processing apparatus of the current embodiment is configured as a vertical processing apparatus used to perform processes such as oxidation, diffusion, and chemical vapor deposition (CVD) processes.

Figure 10:
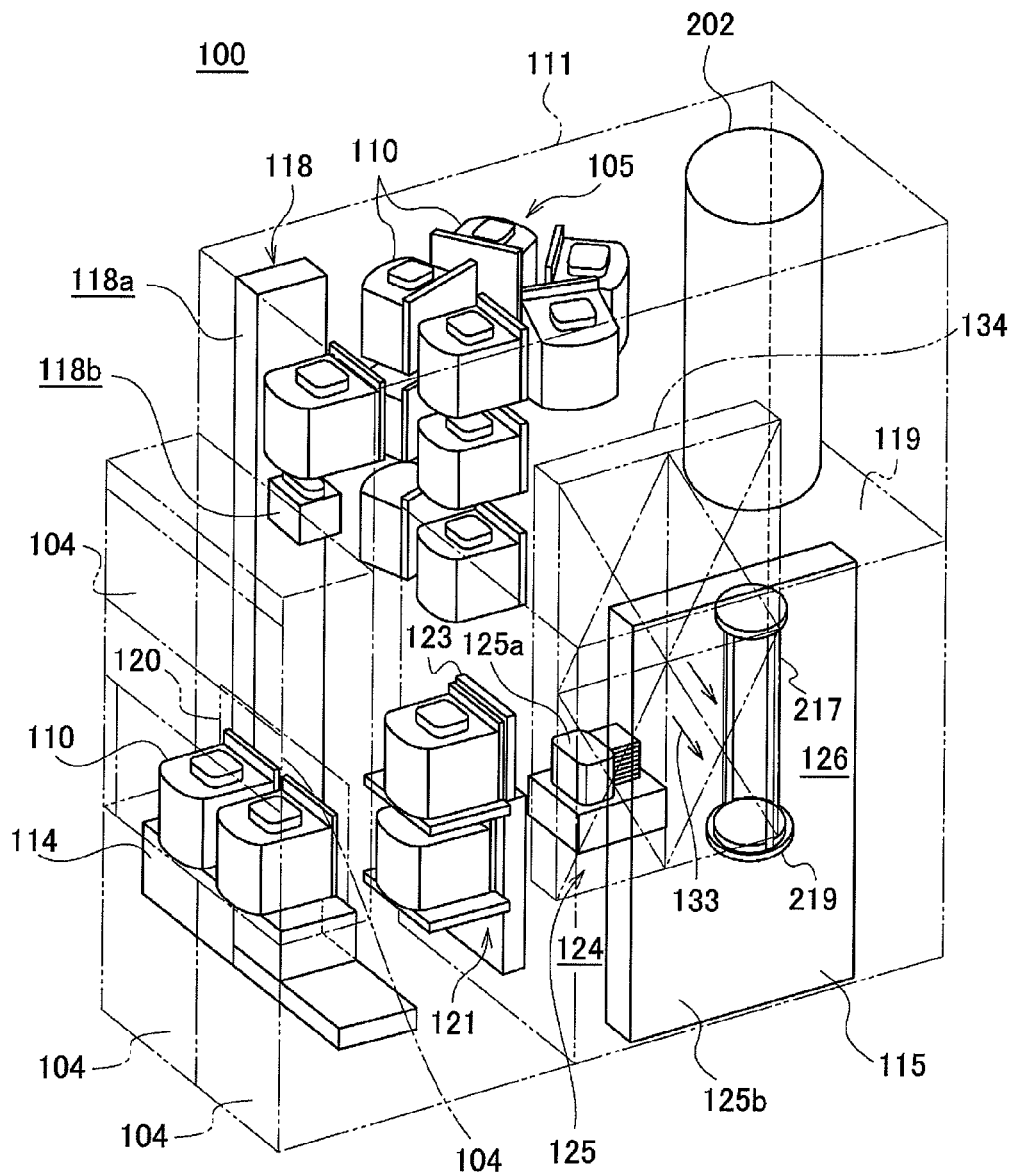
FIG. 10 is a perspective view illustrating a process system according to an embodiment of the present invention.
Figure 11:
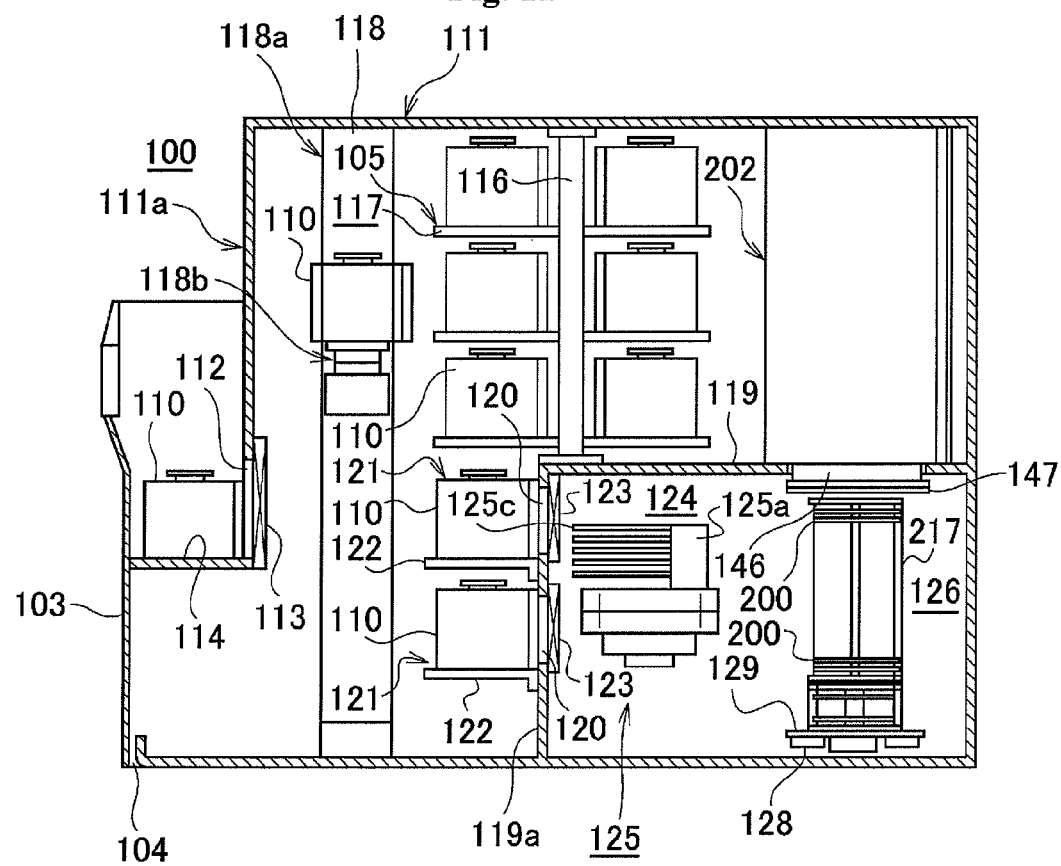
FIG. 11 is a lateral perspective view illustrating the process system according to an embodiment of the present invention.

The substrate processing apparatus of the current embodiment includes: a process system configured to process a substrate; a manipulation unit configured to receive instructions for the process system and display substrate processing states on a manipulation screen; and a control unit configured to control the process system to perform a plurality of steps sequentially. First, the structure of the process system relevant to the current embodiment will now be described. FIG. 10 is a perspective view illustrating a process system 100 relevant to the current embodiment. FIG. 11 is a lateral perspective view illustrating the process system 100 of FIG. 10.

As shown in FIG. 10 and FIG. 11, the process system 100 of the current embodiment includes a housing 111 as a pressure-resistant container. At the front side (left in the FIG. 11) of a front wall 111a of the housing 111, a front maintenance port 103 is formed as an opening for maintenance. At the front maintenance port 103, a pair of front maintenance doors 104 is installed to open and close the front maintenance port 103. To carry substrates such as wafers 200 into and out of the housing 111, carriers (pods) 110 are used as substrate containers.

At the front wall 111a of the housing 111, a carrier port (substrate container port) 112 is formed so that the inside and outside of the housing 111 can communicate with each other. The carrier port 112 is configured to be opened and closed by a front shutter (substrate container port opening/closing mechanism) 113. At the front side of the carrier port 112, a load port (substrate container transfer stage) 114 is installed. Carrier placement positions are provided on the load port 114. The carriers 110 are configured to be placed on the load port 114 and adjusted in position. The carriers 110 are configured to be carried from an outer area of the process system 100 to the load port 114 by an in-process carrying device (not shown) which is a carrying system.

Approximately at the upper center part of the inside of the housing 111 in a front-to-back direction, a rotary carrier shelf (substrate container shelf) 105 is installed. The rotary carrier shelf 105 is configured so that a plurality of carriers 110 can be stored on the rotary carrier shelf 105. The rotary carrier shelf 105 includes a post 116 which is vertically installed and can be intermittently rotated on a horizontal plane, and a plurality of shelf plates (substrate container stages) 117 which is radially supported at upper, middle, and lower positions of the post 116. On the shelf plates 117, carrier placement positions are respectively provided.

Between the load port 114 and the rotary carrier shelf 105 inside the housing 111, a carrier carrying device (substrate container carrying device) 118 is installed as a carrying system. The carrier carrying device 118 includes a carrier elevator (substrate container elevating mechanism) 118a capable of moving upward and downward while holding a carrier 110, and a carrier carrying mechanism (substrate container carrying mechanism) 118b capable of moving the carrier elevator 118a horizontally. The carrier carrying device 118 is configured to carry a carrier 110 among the load port 114, the rotary carrier shelf 105, and carrier openers (substrate container cover opening/closing mechanism) 121 (described later) through successive operations of the carrier elevator 118a and the carrier carrying mechanism 118b.

At the lower part of the inside of the housing 111, a sub housing 119 is installed approximately from the front-to-back center part of the housing 111 to the rear side of the housing 111. At a front wall 119a of the sub housing 119, a pair of wafer ports (substrate ports) 120 are installed in a manner such that the wafer ports 120 are vertically arranged at upper and lower positions, so as to carry wafers 200 into and out of the sub housing 119. At the upper and lower wafer port 120, the carrier openers 121 are respectively installed.

Each of the carrier openers 121 includes a stage 122, and a cap attach/detach mechanism (cover attach/detach mechanism) 123 configured to attach and detach a cap (cover) of a carrier 110. On the stage 122, a carrier placement position is provided. The carrier opener 121 is configured to open and close a wafer port of a carrier 110 placed on the stage 122 by detaching or attaching the cap of the carrier 110 using the cap attach/detach mechanism 123.

In the sub housing 119, a transfer chamber 124 is provided in a manner such that the transfer chamber 124 is fluidically isolated from a space where parts such as the carrier carrying device 118 or the rotary carrier shelf 105 are installed. At the front region of the transfer chamber 124, a wafer transfer mechanism (substrate transfer mechanism) 125 is installed as a carrying system. The wafer transfer mechanism 125 includes a wafer transfer device (substrate transfer device) 125a capable of rotating or straightly moving wafers 200 on a horizontal plane, and a wafer transfer device elevator (substrate transfer device elevator) 125b capable of moving the wafer transfer device 125a upward and downward. As shown in FIG. 10, the wafer transfer device elevator 125b is installed between the front right-end part of the transfer chamber 124 of the sub housing 119 and the right-end part of the housing 111. The wafer transfer device 125a includes tweezers (substrate holding parts) 125c as stage parts for wafers 200. By successive operations of the wafer transfer device 125a and the wafer transfer device elevator 125b, wafers 200 can be charged into or discharged from a boat 217 which is a substrate holder. The boat 217 is configured to hold a plurality of wafers 200 in a state where the wafers 200 are horizontally placed and stacked in multiple stages.

At the rear region of the transfer chamber 124, a standby section 126 is provided as a boat placement position where the boat 217 is accommodated. Above the standby section 126, a process furnace 202 is installed as process system. The bottom side of the process furnace 202 is configured to be opened and closed by a furnace port shutter (furnace port opening/closing mechanism) 147.

Each of the boats 217 is configured to be carried between the standby sections 126 provided at the rear region of the transfer chamber 124 by a boat carrying mechanism (not shown) which is a carrying system.

As shown in FIG. 10, between the right-end part of the standby section 126 of the sub housing 119 and the right-end part of the housing 111, a boat elevator (substrate holder elevating mechanism) 115 is installed for the process furnace 202 as a carrying system for moving the boat 217 upward and downward. Arm 128 is connected to an elevating stage of the boat elevator 115 as a connector. At the arm 128, a seal cap 219 is horizontally installed as a cover part. A boat placement position is provided on the seal cap 219. The seal cap 219 is configured to vertically support the boat 217 from the bottom side of the boat 217 and close the bottom side of the process furnace 202 when the boat 217 is raised.

As shown in FIG. 10, at the left-end part of the transfer chamber 124 opposite to the wafer transfer device elevator 125b and the boat elevator 115, a cleaning unit 134 is installed, which includes a supply fan and a dust filter so as to supply clean air 133 such as cleaned gas or inert gas. Between the wafer transfer device 125a and the cleaning unit 134, a notch aligning device (not shown) is installed as a substrate adjustment device for adjusting circumferential positions of wafers.

After clean air 133 blown through the cleaning unit 134 flows around the notch aligning device (not shown), the wafer transfer device 125a, and the boat 217 placed at the standby section 126, the clean air 133 is sucked through a duct (not shown) and discharged to the outside of the housing 111, or the clean air 133 is circulated to the primary side (supply side) of the cleaning unit 134 (that is, the suction side of the cleaning unit 134) where the clean air 133 is blown again to the inside of the transfer chamber 124.

Next, an operation of the process system 100 relevant to the current embodiment will be described with reference to FIG. 10 and FIG. 11. In the following description, parts of the process system 100 are controlled by a process control module (described later).

As shown in FIG. 10 and FIG. 11, when a carrier 110 is supplied to the load port 114, the carrier port 112 is opened by moving the front shutter 113. Then, the carrier 110 placed on the load port 114 is carried into the housing 111 through the carrier port 112 by the carrier carrying device 118.

The carrier 110 carried into the housing 111 is automatically carried to the shelf stage 117 by the carrier carrying device 118 and temporarily stored on the shelf stage 117, and then the carrier 110 is transferred from the shelf stage 117 to the stage 122 of one of the carrier openers 121. Alternatively, the carrier 110 carried into the housing 111 can be directly transferred to the stage 122 of the carrier opener 121 by the carrier carrying device 118. At this time, since the wafer port 120 corresponding to the carrier opener 121 is closed by the cap attach/detach mechanism 123, the inside of the transfer chamber 124 can be filled with clean air 133 blown into the transfer chamber 124. For example, according to settings, as nitrogen gas is filled in the transfer chamber 124 as clean air 133, the oxygen concentration of the inside of the transfer chamber 124 becomes equal to or lower than, for example, 20 ppm, which is much lower than the oxygen concentration of the inside of the housing 111 which is under ambient atmosphere.

When the carrier 110 is transferred to the stage 122, the opened side of the carrier 110 is pushed against the periphery of an opening of the wafer port 120 formed in the front wall 119a of the sub housing 119, and at the same time, the cap of the carrier 110 is detached by the cap attach/detach mechanism 123, so that the wafer port of the carrier 110 can be opened. Thereafter, a wafer 200 is picked up from the carrier 110 through the wafer port of the carrier 110 by the tweezers 125c of the wafer transfer device 125a and is adjusted in orientation by the notch aligning device, and then the wafer 200 is transferred to the standby section 126 located at the rear side of the transfer chamber 124 and charged into the boat 217. After the wafer transfer device 125a charges the wafer 200 into the boat 217, the wafer transfer device 125a returns to the carrier 110 to charge the nest wafer 200 into the boat 217.

While wafers 200 are charged from one of the carrier openers 121 (the upper or lower carrier opener 121) into the boat 217 by the wafer transfer mechanism 125, another carrier 110 is carried onto the stage 122 of the other of the carrier openers 121 (the lower or upper carrier opener 121) from the rotary carrier shelf 105 by the carrier carrying device 118, so as to perform an opening operation simultaneously on the carrier 110 by using the other carrier opener 121.

If a predetermined number of wafer 200 are charged into the boat 217, the bottom side of the process furnace 202 closed by the furnace port shutter 147 is opened by moving the furnace port shutter 147. Subsequently, the boat 217 in which a group of wafers 200 is held is carried by the boat carrying mechanism (not shown) to the standby section 126 located under the process furnace 202, and as the seal cap 219 is moved upward by the boat elevator 115, the boat 217 is loaded into the process furnace 202.

After boat 217 is loaded, a predetermined process is performed on the wafers 200 in the process furnace 202. After the process, in the approximate reverse order of the loading order except for the wafer aligning process using the notch aligning device, the boat 217 in which the processed wafers 200 are held is unloaded from the inside (process chamber) of the process furnace 202, and carriers 110 in which the processed wafers 200 are held are unloaded from the housing 111.

Figure 9:
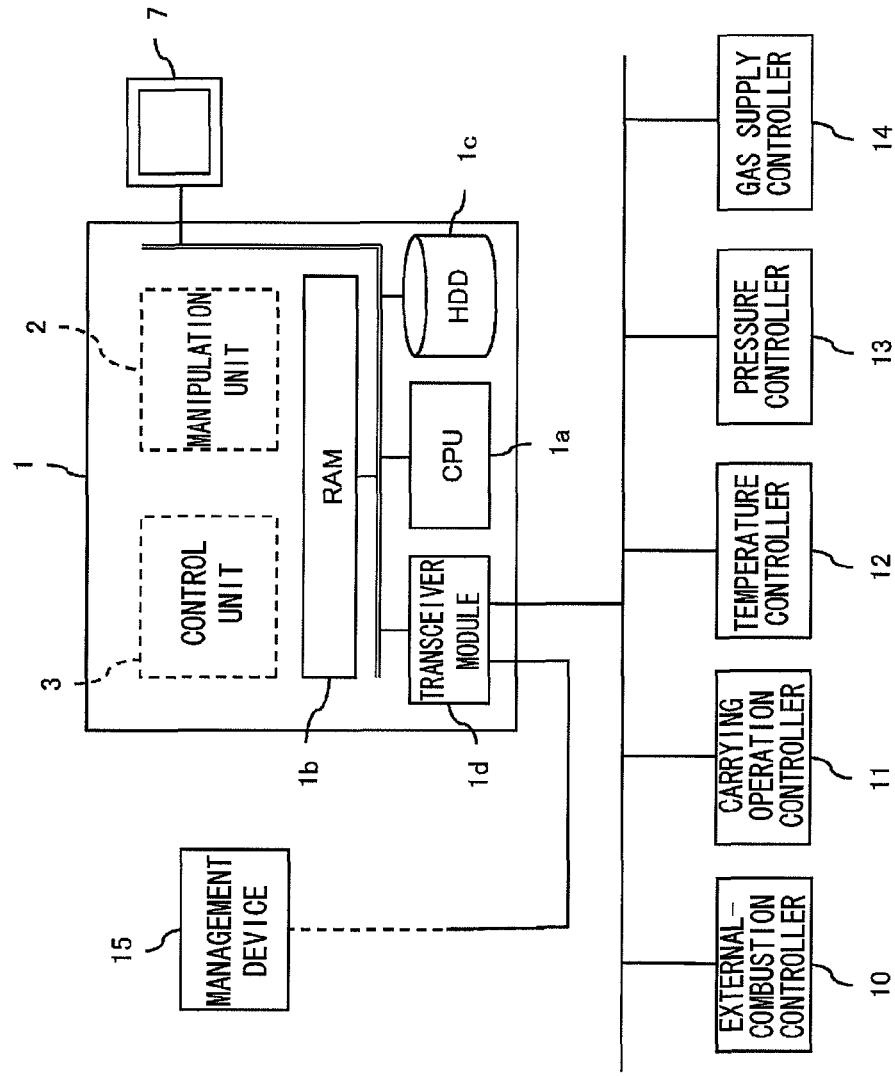
FIG. 9 is a schematic view illustrating a process control module of the substrate processing apparatus and peripheral block structures of the process control module according to an embodiment of the present invention.

Next, a process control module 1 functioning as a device controller for controlling parts of the process system 100, and peripheral block structures of the process control module 1 will now be described with reference to FIG. 9.

The process control module 1 includes a central processing unit (CPU) 1a, a memory 1b such as a random access memory (RAM), a hard disk drive (HDD) 1c which is a fixed storage device, a transmitter, and receiver module 1d, and is a computer having a clock function (not shown). The HDD 1c is used to store various screen files and icon files as well as files such as a manipulation unit program file, a control unit program file, a process recipe file, and an alarm condition table file. A monitor 7 providing a manipulation screen is connected to the process control module 1. A management device 15 such as a host computer or a monitor server is connected to the process control module 1 through the transmitter and receiver module 1*d* so that the management device 15 can communicate with the process control module 1. The monitor 7 is configured as a touch panel, which includes a display screen and an input unit (e.g., a keyboard) as one piece.

An external-combustion controller 10, a carrying operation controller 11, a temperature controller 12, a pressure controller 13, and a gas supply controller 14 are connected as sub controllers to the process control module 1 through the transmitter and receiver module 1*d* for communication therebetween. The external-combustion controller 10 is configured to control a combustion operation of an external-combustion device (not shown) provided in the process system 100. The carrying operation controller 11 is configured to control carrying operations of the in-process carrying device, the carrier carrying device 118, the wafer transfer mechanism 125, the boat carrying mechanism, and the boat elevator 115, respectively. The temperature controller 12 is configured to adjust the inside temperature of the process furnace 202 by controlling the temperature of a heater (not shown) disposed around the process furnace 202. The pressure controller 13 is configured to control the operation of a decompression exhaust device such as a vacuum pump installed at an exhaust pipe (not shown) through which the inside of the process furnace 202 is exhausted, and to adjust the opened area of a pressure adjusting valve installed at the exhaust pipe. The gas supply controller 14 is configured to allow or interrupt supply of gas through at least one process gas supply pipe (not shown) connected to the inside of the process furnace 202 by opening or closing a gas valve (not shown) installed at the process gas supply pipe. In addition, the gas supply controller 14 is configured to control the amount of gas supplied to the inside of the process furnace 202 by adjusting the opened degree of a flowrate controller (not shown) installed at the process gas supply pipe.

The process recipe file is a file for determining the sequence of substrate processing processes. In the process recipe file, set values (control values) to be transmitted to sub controllers, such as the external-combustion controller 10, the carrying operation controller 11, the temperature controller 12, the pressure controller 13, and the gas supply controller 14, are set for each substrate processing step. In the alarm condition table file, an alarm condition table is stored. FIG. 8 is a schematic view illustrating exemplary error handling actions set in an alarm condition table for each step of a process recipe. Referring to FIG. 8, the alarm condition table is set for each step so as to be selected according to errors. Error handling actions set in the alarm condition table includes BUZZER, END, SYSTEM, RESET, and JUMP. BUZZER is to generate a buzzer sound. END is to terminate a recipe. SYSTEM is to execute an alarm recipe. JUMP is to jump to a designated step. RESET is to operate a device in reset mode.

The manipulation unit program file is loaded from the HDD 1*c* into the memory 1*b* and is executed by the CPU 1*a* so as to embody a manipulation unit 2 in the process control module 1. The manipulation unit 2 is configured to receive instructions for the process system 100 while displaying processing states of wafers 200 on the monitor 7.

The control unit program file is loaded from the HDD 1*c* into the memory 1*b* is executed by the CPU 1*a* so as to embody a control unit 3 in the process control module 1. The control unit 3 is configured to control the process system 100 for performing a plurality of steps sequentially. Specifically, the control unit 3 is configured to control the operation of the process system 100 by reading data such as the process recipe file, a recovery recipe file, and the alarm condition table file from the HDD 1*c* and transmitting various set values (control values) defined in such recipes to the sub controllers such as the external-combustion controller 10, the carrying operation controller 11, the temperature controller 12, the pressure controller 13, and the gas supply controller 14 at predetermined times.

The manipulation unit 2 and the control unit 3 are configured to utilize a shared memory region dynamically allocated in the memory 1*b* when the manipulation unit program and the control unit program are executed, and configured to communicate with each other (inter-process communication). For example, if one of the manipulation unit 2 and the control unit 3 writes a message in the shared memory region, the other of the manipulation unit 2 and the control unit 3 reads the message from the shared memory region at a predetermined time. In addition, the manipulation unit 2 and the control unit 3 can receive time information from a clock of the process control module 1.

(2) Substrate Processing Process

Figure 1:
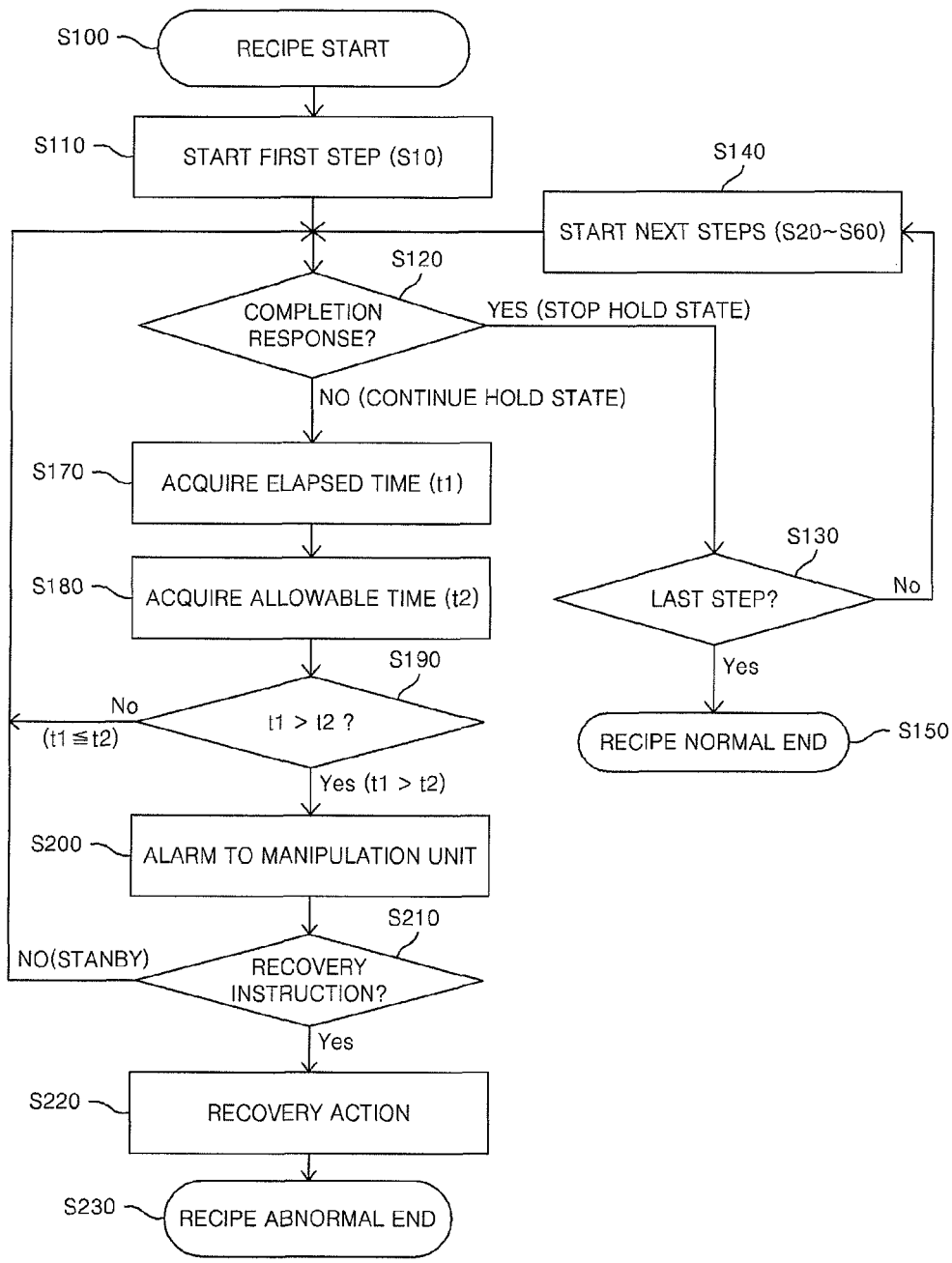
FIG. 1 is a flowchart for explaining an exemplary operation of a control unit of a substrate processing apparatus according to an embodiment of the present invention.
Figure 2:
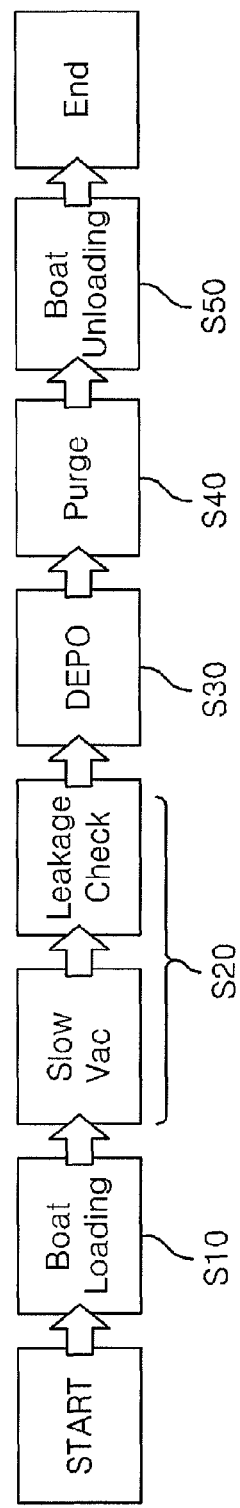
FIG. 2 is a flowchart for explaining a substrate processing process according to an embodiment of the present invention.

Next, as one of semiconductor device manufacturing processes, a substrate processing process using the above-described substrate processing apparatus will now be described. FIG. 1 is a flowchart for explaining exemplary operations of the control unit of the substrate processing apparatus according to an embodiment of the present invention. FIG. 2 is a flowchart for explaining a substrate processing process according to an embodiment of the present invention.

(Normal Operation)

First, an explanation will be given on a substrate processing process performed in a normal condition where no step is delayed.

As shown in FIG. 2, according to the current embodiment, the substrate processing apparatus is configured to sequentially perform the following steps: a boat loading step S10 in which the boat 217 holding wafers 200 is loaded into the process furnace (process chamber) 202 kept at a standby temperature; a decompression (slow vac. and leakage check) step S20 in which the inside pressure of the process furnace 202 is decreased from atmospheric pressure to a process pressure; a film forming (DEPO) step S30 in which the wafers 200 are processed by supplying process gas to the inside of the process furnace 202; an atmospheric pressure return (purge) step S40 in which the inside pressure of the process furnace 202 is returned from the process pressure to atmospheric pressure; and a boat unload step S50 in which the boat 217 holding the processed wafers 200 is unloaded from the process furnace 202. Together with the decompression step S20, a temperature increasing step is performed to increase the inside temperature of the process furnace 202 from the standby temperature to a process temperature, and together with the atmospheric pressure return step S40, a temperature decreasing step is performed to decrease the inside temperature of the process furnace 202 from the process temperature to the standby temperature. However, the temperature increasing step and the temperature decreasing step are not illustrated.

FIG. 1 illustrates exemplary operations of the control unit 3 during the above-described substrate processing process. In other words, FIG. 1 is a flowchart for explaining exemplary operations of the control unit 3 of the substrate processing apparatus according to an embodiment of the present invention.

First, the manipulation unit 2 receives a □recipe start instruction□ from an operator and writes a message on a shared memory region allocated in the memory 1*b* to report the ▢recipe start instruction▢. The control unit 3 reads the message from the shared memory region and starts a recipe (S100).

The control unit 3 starts the first step (the boat loading step S10 in the current embodiment) of a plurality of steps of the recipe (S110). In detail, while referring to the process recipe file, the control unit 3 transmits various set values to the carrying operation controller 11 at a predetermined time. In addition, the time (recipe start time) at which the set values are transmitted to the carrying operation controller 11 is recorded in the shared memory region by the control unit 3.

Thereafter, until the control unit 3 receives a response (execution completion response) from a sub controller, the control unit 3 remains in standby state (hold state) instead of starting the next step (S120). If the control unit 3 receives a execution completion response from a sub controller ("Yes" in step 120), the control unit 3 determines whether the completed step is the last step of the recipe (the boat unload step S50 in the current embodiment) (S130).

If the completed step is not the last step, the control unit 3 selects the "No" option in step S130 to start the next step (the decompression (slow vac. and leakage check) step S20) (S140). In detail, while referring to the process recipe file, the control unit 3 transmits various set values to the pressure controller 13 and the gas supply controller 14. Thereafter, the control unit 3 repeats steps S120 to S140 so as to sequentially perform the boat loading step S10, the decompression (slow vac. and leakage check) step S20, the film forming (DEPO) step S30, the atmospheric pressure return (purge) step S40, and the boat unload step S50.

If the last step (Boat Unload step S50) is performed ("No" in step 130), the control unit 3 writes a message in the shared memory region to report a normal end of the recipe, and at the same time, the control unit 3 transmits a related message to the management device 15 (S150). Meanwhile, the manipulation unit 2 reads the message reporting a normal end of the recipe from the shared memory region and displays the message on the monitor 7 to inform an operator of the message.

(Step Delay Operation)

As described above, due to defects or malfunctioning of the substrate processing apparatus, any one of step S10 to step S50 can be delayed.

For example, the boat loading step S10 or the boat unload step S50 may be delayed due to the breakdown or malfunction of the in-process carrying device, the carrier carrying device 118, the wafer transfer mechanism 125, the boat carrying mechanism, or the boat elevator 115. In addition, set values transmitted from the control unit 3 to a sub controller, or an operation completion notice transmitted from the sub controller to the control unit 3 may not be delivered due to failure of communication. That is, due to these factors of delay, in some cases, a carrying operation may not be started or terminated. Moreover, although a carrying operation is normally started or terminated, it can be mistaken for an undersigned operation.

In addition, the decompression (slow vac. And leakage check) step S20, the temperature increasing step, the atmospheric pressure return (purge) step S40, and the temperature decreasing step may be delayed due to the degradation or malfunction of devices such as various sensors (e.g., a pressure sensor and a temperature sensor) installed in the process furnace 202, the heater, the vacuum pump, or the pressure adjusting valve. Moreover, the steps may be delayed to failure of communication between the control unit 3 and a sub controller. Due to these factors of delay, the inside pressure or temperature of the process furnace 202 may not be adjusted to a desired level. Furthermore, although adjustment to a desired temperature or pressure is successfully carried out, sometimes it can be mistaken for an adjustment failure.

In addition, the film forming (DEPO) step S30 can be delayed due to the degradation or malfunction of various sensors (e.g., a pressure sensor and a temperature sensor), the vacuum pump, the pressure adjusting value, the gas valve, or the flowrate controller. Moreover, the film forming (DEPO) step S30 can be delayed to failure of communication between the control unit 3 and a sub controller. Due to these factors of delay, supply of a desired amount of gas to the inside of the process furnace 202 may not be started or terminated, or the gas concentration of the inside of the process furnace 202 may not be adjusted to a desired level. Furthermore, although supply of gas to the inside of the process furnace 202 or gas concentration adjustment is properly carried out, it can be mistaken for a supply or adjustment failure.

In the case of a conventional substrate processing apparatus, it is difficult for an operator to recognize a delay of step rapidly. That is, in a conventional substrate processing apparatus, unless an operator checks the state of a substrate processing process, for example, by handling a manipulation screen, the operator cannot recognize whether any step is delayed or not, and moreover, it is difficult for the operator to recognize a delay of step manually. In addition, although a step is delayed, the step is often completed without any problem though no action is taken; thus, in a conventional substrate processing apparatus, although a step is delayed, it is not considered as an abnormal state. Therefore, in a conventional substrate processing apparatus, recovery action for a delay of step is taken late. As a result, for example, a substrate (wafer) can be left in a high-temperature process furnace for a long time, causing thermal damage of the substrate (lot-out).

However, the substrate processing apparatus of the current embodiment is configured such that if progress of step is delayed due to any reason, the delay of step can be rapidly reported to an operator. Hereinafter, the operation of the control unit 3 during a delay of step will be explained with reference to FIG. 1.

As described above, after the control unit 3 starts one of the steps S10 to S50, the control unit 3 goes into standby state (hold state) and stays in the standby state until an execution completion response is received from a sub controller (refer to "No" in the step S120)

In hold state, the control unit 3 periodically measures an elapsed time t1 from the start of the step until an execution completion response is received from a sub controller (S170).

In detail, the control unit 3 measures an elapsed time t1 by reading a time set in a recipe in the step S110 and counting a hold time based on the read time until an execution completion response is received from a sub controller.

After measuring the elapsed time t1, the control unit 3 acquires an allowable time t2 allocated to the current step by referring to the alarm condition table file stored in the HDD 1c (S180). For example, if the current step is the boat loading step S10, the control unit 3 acquires "00:20:00" as the allowable time t2.

Thereafter, the control unit 3 compares the elapsed time t1 and the allowable time t2 (S190). If the control unit 3 determines that the elapsed time t1 does not exceed the allowable time t2 (▢No) in S190), the control unit 3 remains in hold state and goes back to the step 120. On the other hand, if the elapsed time t1 exceeds the allowable time t2 (□Yes□ in S190), the control unit 3 writes an alarm message in the shared memory region to report that the elapsed time t1 exceeds the allowable time t2, so that the manipulation unit 2 can be informed of the message that the current step is delayed due to a certain reason (S200). Thereafter, until a "recovery action" instruction is written in the shared memory region by the manipulation unit 2, while the control unit 3 remains in standby state (hold state), the control unit 3 periodically repeats the step 170 and the following steps ("No" in S210).

When the manipulation unit 2 reads the alarm message reporting that the elapsed time t1 exceeds the allowable time t2 from the shared memory region, the manipulation unit 2 displays a standby monitor screen 7w (such as a screen indicating why the allowable time t2 is exceeded to generate an alarm) on the monitor 7 so as to demand a recovery action on the current step (the delayed step).

Figure 7:
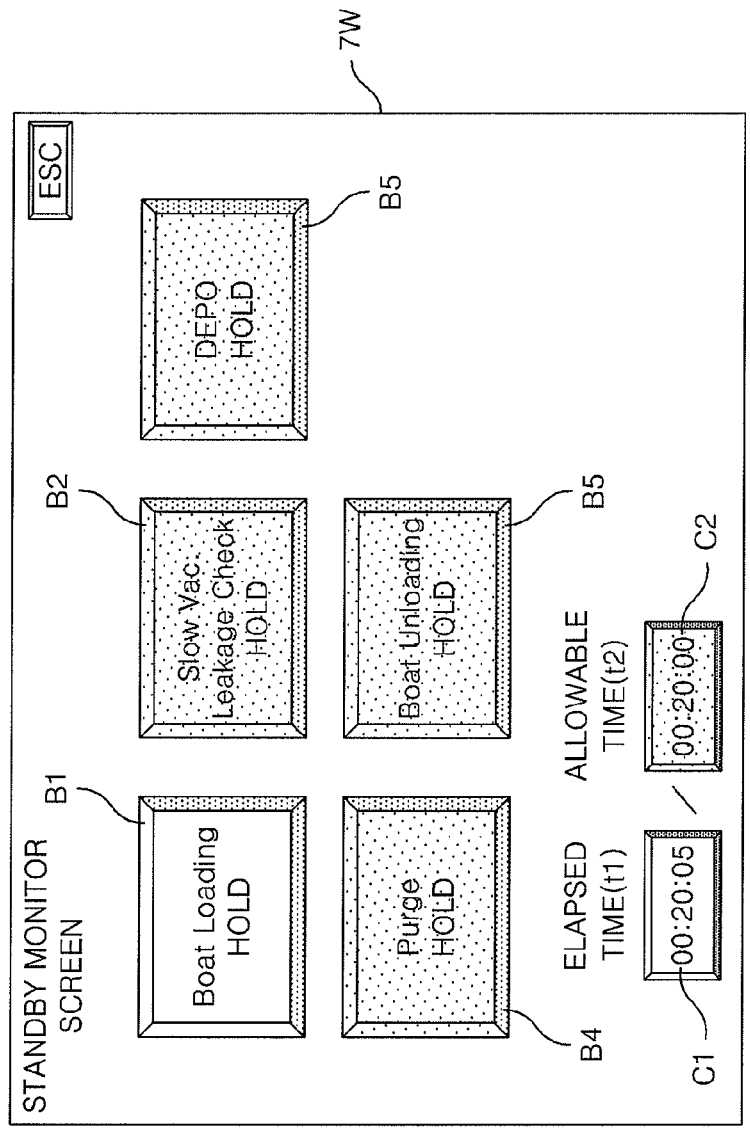
FIG. 7 is a schematic view illustrating an exemplary standby monitor screen displayed as a manipulation screen by a manipulation unit of the substrate processing apparatus according to an embodiment of the present invention.

FIG. 7 is a schematic view illustrating an exemplary standby monitor screen 7w displayed on the monitor 7 by the manipulation unit 2. As shown in FIG. 7, the standby monitor screen 7w is configured such that lamps (icons) B1 to B5 corresponding to steps of a recipe can be displayed. For example, a lamp corresponding to a delayed step is turned on, and lamps corresponding to the other steps (completed steps or the next steps) are turned off, so that an operator can easily recognize the delayed step (in the example shown in FIG. 7, the lamp B1 is turned on, and the lamps B2 to B5 are turned off, so as to indicate that the boat loading step S10 is delayed).

On the standby monitor screen 7w of FIG. 7, together with the lamps B1 to B5, the elapsed time t1 and the allowable time t2 are respectively displayed in sections C1 and C2. When the manipulation unit 2 displays the standby monitor screen 7w, the manipulation unit 2 reads a recipe start time recorded in the shared memory region in the step S110. In addition, the manipulation unit 2 acquires the allowable time t2 previously allocated to the current step by referring to the alarm condition table file. Then, the manipulation unit 2 acquires the elapsed time t1 from a hold time of each step of the recipe. Meanwhile, the manipulation unit 2 periodically updates the elapsed time t1 displayed in the section C1.

The control unit 3 staying in hold state reads an error handling action from the alarm condition table stored in the shared memory region so as to perform a predetermined recovery action ("Yes" is selected in step S210, and step S220 is performed). In detail, the control unit 3 reads a recovery action corresponding to a step to be forcibly terminated by referring to the alarm condition table file. For example, if the recovery action is "SYSTEM" shown in FIG. 8, an alarm recipe is performed, like in the case of a process recipe, by transmitting various set values to the carrying operation controller 11, the temperature controller 12, the pressure controller 13, and the gas supply controller 14 at predetermined times. The control unit 3 stays in hold state until the control unit 3 receives a response (recovery action completion response) reporting a completion of the recovery action from a sub controller.

After the control unit 3 receive a recovery action completion response from a sub controller, the control unit 3 writes a message in the shared memory region to report that the recipe is abnormally terminated (abnormal end), and concurrently, the control unit 3 transmits the message to the management device 15. If the recipe is resumed after the recovery action, the control unit 3 may write a message in the shared memory region so as to report the abnormal end of the recipe after the recipe is completed, and concurrently, the control unit 3 may transmit the message to the management device 15 (S230). Then, the manipulation unit 2 reads the message reporting the abnormal end of the recipe from the shared memory region, and the manipulation unit 2 displays the message on the monitor 7.

(3) Effects Relevant to the Current Embodiment

According to the current embodiment, one or more of the following effects can be attained.

(a) According to the current embodiment, after the control unit 3 starts one of the steps S10 to S50, the control unit 3 goes into standby state (hold state) and periodically compares an elapsed time t1 with an allowable time t2. Then, if the elapsed time t1 exceeds the allowable time t2, the control unit 3 writes an alarm message in a shared memory region to report that the elapsed time t1 exceeds the allowable time t2, so that the manipulation unit 2 can be informed of a delay of the current step caused by a certain reason. Since it is configured that lamps B1 to B5 corresponding to steps of a recipe are displayed on the standby monitor screen 7w, an operator can easily perceive that which of the steps is delayed.

As a result, without having to manipulate the monitor 7 or a touch panel for checking the state of the substrate processing apparatus, an operator can easily and rapidly perceive a delayed step. Therefore, for example, it can be prevented that a substrate (wafer) is left in a high-temperature process furnace for a long time and is thermally damaged.

(b) According to the current embodiment, in the standby monitor screen 7w displayed on the monitor 7 by the manipulation unit 2, as well as the lamps B1 to B5, sections C1 and C2 are provided for indicating an elapsed time t1 and an allowable time t2, respectively. In addition, the manipulation unit 2 periodically updates the elapsed time t1 displayed in the section C1.

Therefore, an operator can easily perceive how long a step is delayed, and thus the operator can easily determine whether to terminate the step forcibly.

(c) In addition, an operator can perform a predetermined recovery action promptly. That is, since an operator can select a recovery action simply from error handling actions previously registered in the alarm condition table for every step, the operator can rapidly start the recovery action without having to investigate a detailed recovery action sequence every time.

As explained in (a) to (c), according to the current embodiment, while a recipe is performed, if a step is delayed due to an error seemed to be related to the quality of a wafer 200, progress to the next step is stopped, and at the same time, the delay of the step is reported to an operator to demand forcible termination of the step, so that a secondary damage of the wafer 200 can be prevented in consecutive batch processing.

EMBODIMENTS

Hereinafter, embodiments of the present invention will be described with reference to FIG. 3 to FIG. 9.

Embodiment 1

Figure 3:
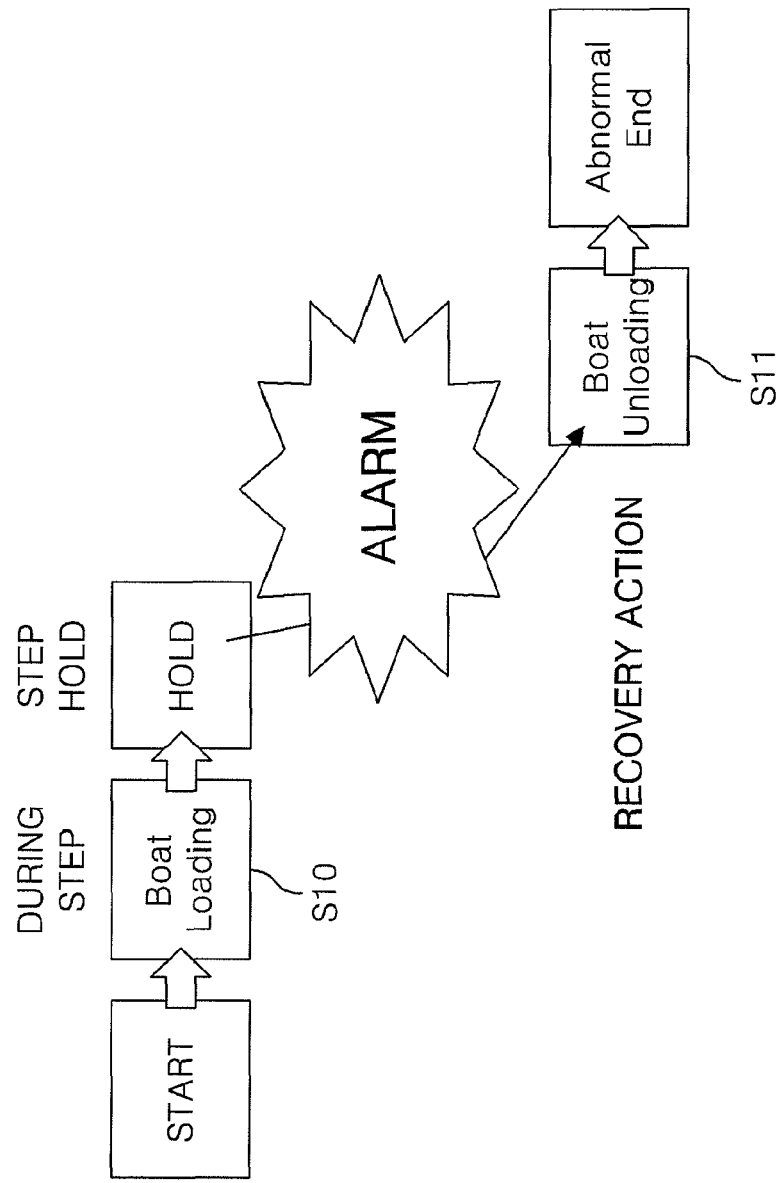
FIG. 3 is a flowchart for explaining an exemplary operation of the substrate processing apparatus in the case where the elapsed time of a boat loading step exceeds an allowable time in a substrate processing process according to an embodiment of the present invention.

FIG. 3 is a flowchart for explaining an exemplary operation of the substrate processing apparatus in the case where the elapsed time of the boat loading step S10 exceeds the allowable time.

Referring to FIG. 3, if the boat loading step S10 is delayed, the control unit 3 staying in hold state writes an alarm message in a shared memory region to report that an elapsed time t1 exceeds an allowable time t2 so that the manipulation unit 2 can be informed of the delay of the boat loading step S10 caused by a certain reason. Then, the control unit 3 staying in hold state reads an "error handling action (alarm condition table)"☐ instruction from the shared memory region and perform a predetermined recovery action (boat unload step S11 in the current embodiment). If the control unit 3 receives a response reporting completion of the recovery action from a sub controller, the control unit 3 writes a message in the shared memory region to report an abnormal end of a recipe, and concurrently, the control unit 3 transmits the message to the management device 15. The manipulation unit 2 reads the message reporting the abnormal end from the shared memory region and displays the message on the monitor 7.

According to the current embodiment, without having to manipulate the monitor 7 or a touch panel for checking the state of the substrate processing apparatus, an operator can easily and rapidly perceive that the boat loading step S10 is delayed. Furthermore, the operator can perform a predetermined recovery action promptly so as to prevent wafers 200 held in the boat 217 from being damaged because the boat 217 is accidentally left in the process furnace 202 at a high temperature for a long time.

Embodiment 2

Figure 4:
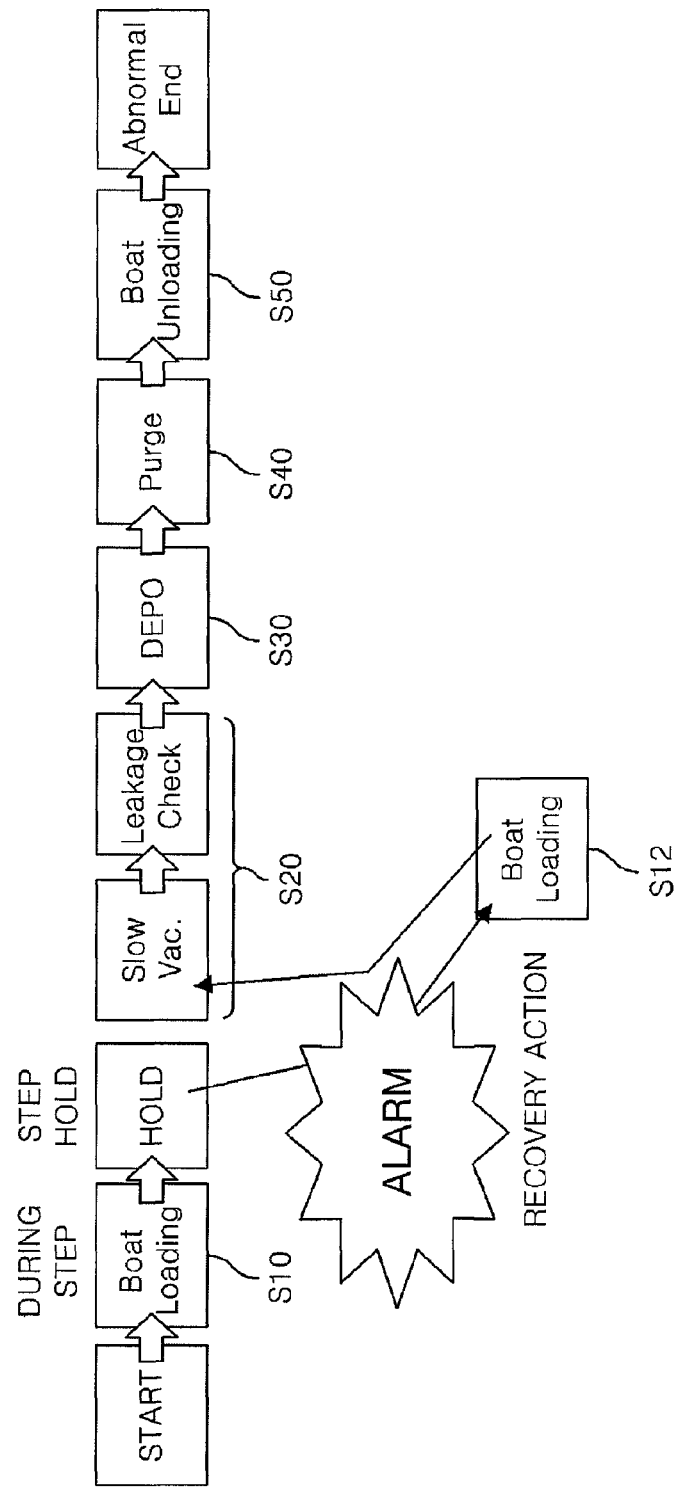
FIG. 4 is a flowchart for explaining another exemplary operation of the substrate processing apparatus in the case where the elapsed time of the boat loading step exceeds the allowable time in a substrate processing process according to an embodiment of the present invention.

FIG. 4 is a flowchart for explaining another exemplary operation of the substrate processing apparatus in the case where the elapsed time of the boat loading step S10 exceeds the allowable time.

Referring to FIG. 4, if the boat loading step S10 is delayed, the control unit 3 staying in hold state writes an alarm message in a shared memory region to report that an elapsed time t1 exceeds an allowable time t2 so that the manipulation unit 2 can be informed of the delay of the boat loading step S10 caused by a certain reason. Then, the control unit 3 staying in hold state reads an "error handling action (alarm condition table)☐" instruction from the shared memory region and perform a predetermined recovery action. In the current embodiment, a boat loading step is performed again (S12), and then, the decompression (slow vac. and leakage check) step S20, the film forming (DEPO) step S30, the atmospheric pressure return (purge) step S40, and the boat unload step S50 are sequentially performed. If the control unit 3 receives a response reporting completion of the recovery action (S12 to S50) from a sub controller, the control unit 3 writes a message in the shared memory region to report an abnormal end of a recipe, and concurrently, the control unit 3 transmits the message to the management device 15. The manipulation unit 2 reads the message reporting the abnormal end from the shared memory region and displays the message on the monitor 7.

According to the current embodiment, without having to manipulate the monitor 7 or a touch panel for checking the state of the substrate processing apparatus, an operator can easily and rapidly perceive that the boat loading step S10 is delayed. Furthermore, the operator can perform a predetermined recovery action promptly, and if the boat loading step is successfully re-performed (S12), substrate processing can be resumed.

Embodiment 3

Figure 5:
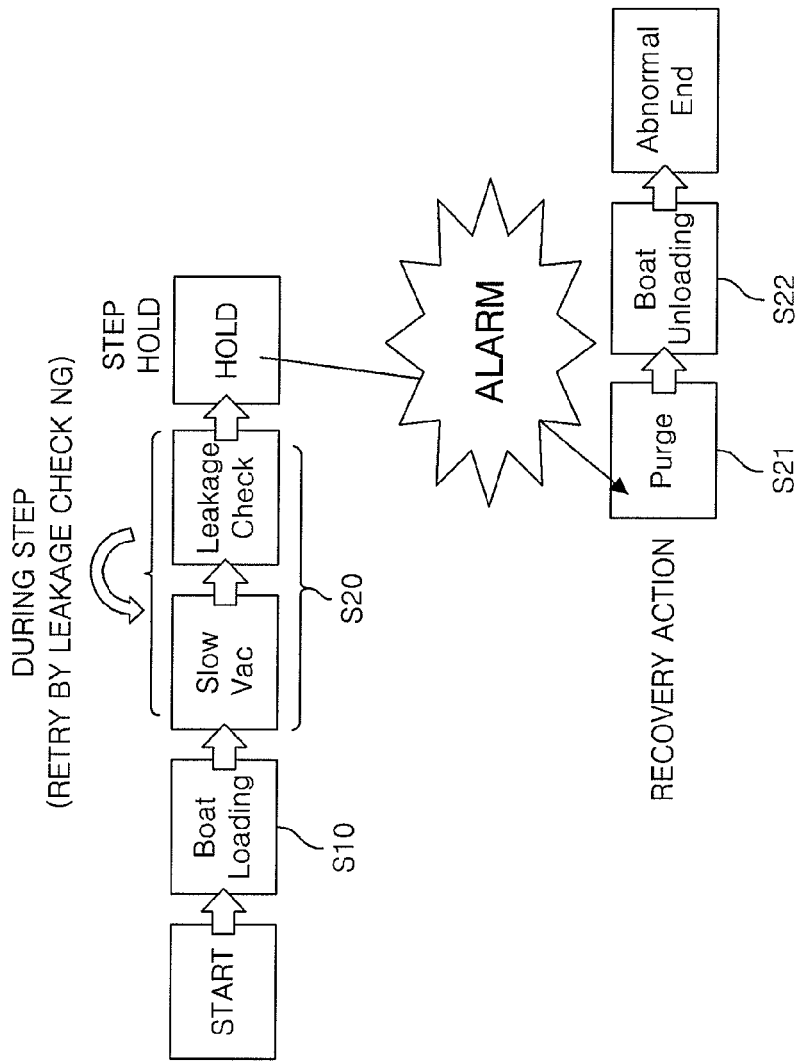
FIG. 5 is a flowchart for explaining an exemplary operation of the substrate processing apparatus in the case where the elapsed time of a decompression (slow vac. and leakage check) step exceeds an allowable time in a substrate processing process according to an embodiment of the present invention.

FIG. 5 is a flowchart for explaining an exemplary operation of the substrate processing apparatus in the case where the elapsed time of the compression (slow vac. and leakage check) step S20 exceeds the allowable time.

Referring to FIG. 5, if the compression (slow vac. and leakage check) step S20 is delayed (for example, if leakage checking is unclear although exhausting (slow vac.) is retried a plurality of times), the control unit 3 staying in hold state writes an alarm message in a shared memory region to report that an elapsed time t1 exceeds an allowable time t2 so that the manipulation unit 2 can be informed of the delay of the compression (slow vac. and leakage check) step S20 caused by a certain reason. Then, the control unit 3 staying in hold state reads an "error handling action (alarm condition table)"☐ instruction from the shared memory region and perform a predetermined recovery action (an atmospheric pressure return (purge) step S21 and a boat unload step S22 in the current embodiment). If the control unit 3 receives a response reporting completion of the recovery action from a sub controller, the control unit 3 writes a message in the shared memory region to report an abnormal end of a recipe, and concurrently, the control unit 3 transmits the message to the management device 15. The manipulation unit 2 reads the message reporting the abnormal end from the shared memory region and displays the message on the monitor 7.

According to the current embodiment, without having to manipulate the monitor 7 or a touch panel for checking the state of the substrate processing apparatus, an operator can easily and rapidly perceive that the compression (slow vac. and leakage check) step S20 is delayed. Furthermore, the operator can perform a predetermined recovery action promptly so as to prevent wafers 200 held in the boat 217 from being damaged because the boat 217 is accidentally left in the process furnace 202 which is not decompressed.

Embodiment 4

Figure 6:
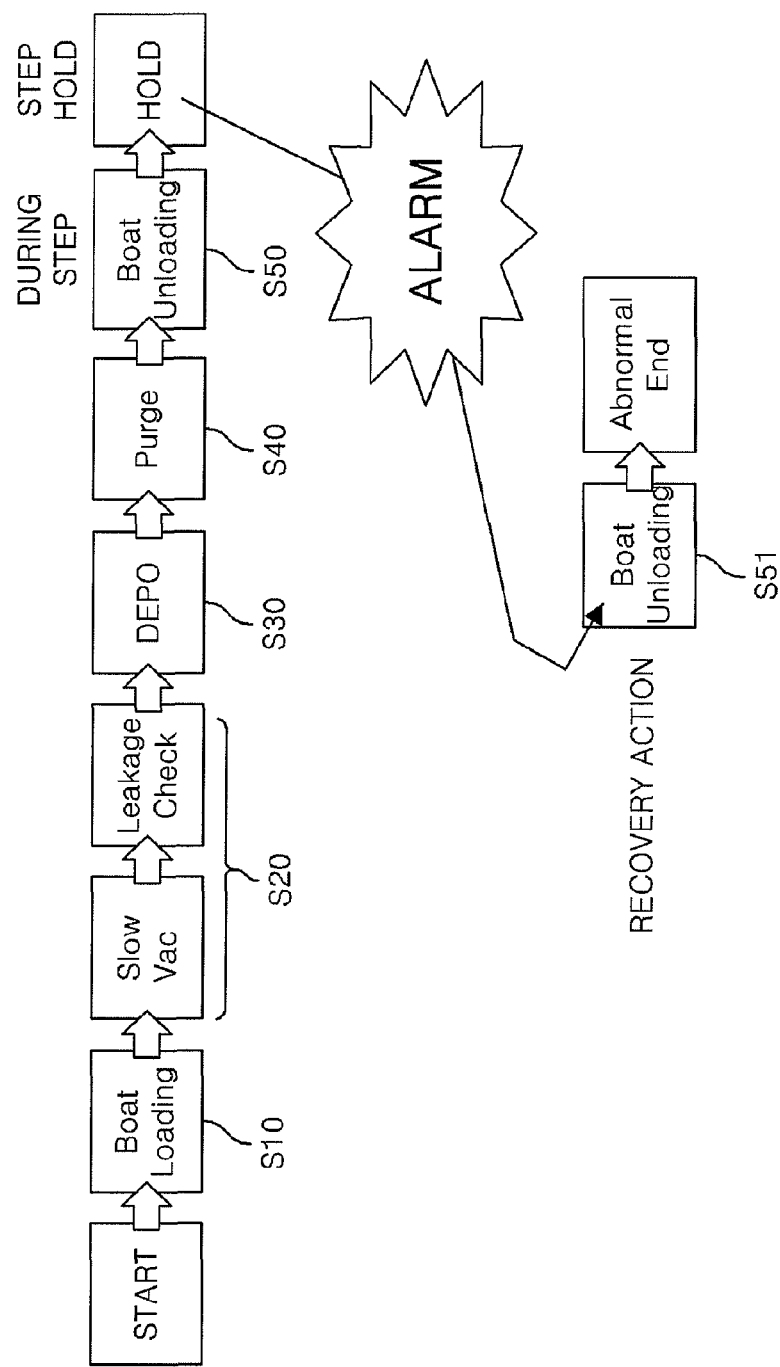
FIG. 6 is a flowchart for explaining an exemplary operation of the substrate processing apparatus in the case where the elapsed time of a boat unload step exceeds an allowable time in a substrate processing process according to an embodiment of the present invention.

FIG. 6 is a flowchart for explaining an exemplary operation of the substrate processing apparatus in the case where the elapsed time of the boat unload step S50 exceeds the allowable time.

Referring to FIG. 6, if the boat unload step S50 is delayed, the control unit 3 staying in hold state writes an alarm message in a shared memory region to report that an elapsed time t1 exceeds an allowable time t2 so that the manipulation unit 2 can be informed of the delay of the boat unload step S50 caused by a certain reason. Then, the control unit 3 staying in hold state reads an "error handling action (alarm condition table)☐" instruction from the shared memory region and perform a predetermined recovery action (in the current embodiment, a boat unload step is re-preformed (S51)). If the control unit 3 receives a response reporting completion of the recovery action from a sub controller, the control unit 3 writes a message in the shared memory region to report an abnormal end of a recipe, and concurrently, the control unit 3 transmits the message to the management device 15. The manipulation unit 2 reads the message reporting the abnormal end from the shared memory region and displays the message on the monitor 7.

According to the current embodiment, without having to manipulate the monitor 7 or a touch panel for checking the state of the substrate processing apparatus, an operator can easily and rapidly perceive that the boat unload step S50 is delayed. Furthermore, the operator can perform a predetermined recovery action promptly and complete the recipe speedily by unloading processed wafers 200 rapidly.

According to the substrate processing apparatus of the present invention, when the progress of a step is delayed due to a certain reason, an operator can be quickly informed of the delay of step.

(Supplementary Note)

The present invention also includes the following preferred embodiments.

(Supplementary Note 1)

According to a preferred embodiment of the present invention, there is provided a substrate processing apparatus comprising: a process system configured to process a substrate; a control unit configured to control the process system for performing a plurality of steps; and a manipulation unit configured to monitor progresses of the steps, wherein while the control unit waits for completion of a predetermined one of the steps after the control unit controls the process system to start the predetermined step, if a time elapsed from the start of the predetermined step exceeds an allowable time previously allocated to each of the steps, the control unit transmits an alarm message to the manipulation unit so as to inform the manipulation unit of the message that the allowable time is exceeded.

(Supplementary Note 2)

In the substrate processing apparatus of Supplementary Note 1, it is preferable that when the alarm message is generated, the control unit takes a predetermined error handling action for correcting an error, and the control unit proceeds to the next step after the error is corrected.

(Supplementary Note 3)

In the substrate processing apparatus of Supplementary Note 2, it is preferable that the predetermined error handling action is to re-perform the step during which the alarm is generated.

(Supplementary Note 4)

In the substrate processing apparatus of Supplementary Note 1, it is preferable that although a time for starting the next step is exceeded while the current step is performed, the control unit does not control the process system to start the next step.

(Supplementary Note 5)

According to another preferred embodiment of the present invention, there is provided a substrate processing apparatus comprising a control unit configured to perform a recipe comprising a plurality of steps, wherein if a time elapsed from start of any one of the steps exceeds an allowable time previously set for the step, the control unit performs a predetermined error handling action, and then the control unit generates an alarm message for indicating an abnormal end.

(Supplementary Note 6)

In the substrate processing apparatus of Supplementary Note 5, it is preferable that after the control unit performs the error handling action, the control unit temporarily stops the next execution of the recipe.

(Supplementary Note 7)

In the substrate processing apparatus of Supplementary Note 5, it is preferable that although a time for starting the next step is exceeded while the current step is performed, the control unit does not control the process system to start the next step.

(Supplementary Note 8)

According to another preferred embodiment of the present invention, there is provided a substrate processing apparatus comprising a manipulation unit configured to display a plurality of steps, in which substrate processing conditions are set in a time-series manner, on a manipulation screen, and to prepare or edit a recipe using the manipulation screen, wherein if a predetermined button is pressed, for each of the steps, the manipulation unit displays a standby monitor screen to indicate a set value of a standby time, a measured value of the standby time, and an item performed in any one of the steps, and during the standby time, the control unit counts up the measured value of the standby time on the standby monitor screen and clearly specifies the item relating to the standby time on the standby monitor screen.

(Supplementary Note 9)

According to another preferred embodiment of the present invention, there is provided a method of manufacturing a semiconductor device by performing a recipe constituted by a plurality of steps, the method comprising: loading a substrate holder in which a substrate is held into a process furnace; increasing temperature of the process furnace from a standby temperature to a film-forming temperature; forming a film on the substrate by performing a predetermined process on the substrate; decreasing the temperature of the process furnace from the film-forming temperature to the standby temperature; and unloading the substrate holder from the process furnace, wherein if a time elapsed from start of a step exceeds an allowable time previously allocated to the step, an alarm message is provided so as to report that the allowable time is exceeded.

Another Embodiment of the Present Invention

In the above-described embodiments, a semiconductor manufacturing apparatus is explained as a substrate processing apparatus. However, the present invention is not limited thereto. For example, the present invention can be applied to a glass substrate processing apparatus such as a liquid crystal display (LCD) apparatus. In addition, the present invention can be applied to any substrate processing process such as an annealing process, an oxidation process, a nitriding process, and a diffusion process, as well as a film-forming process. For example, the film-forming process may be a chemical vapor deposition (CVD) film-forming process, a physical vapor deposition (PVD) film-forming process, an oxide film forming process, a nitride film forming process, or a metal-containing film forming process. Furthermore, the present invention can be suitably applied to any other substrate processing apparatus (such as an exposing apparatus, a lithography apparatus, a coating apparatus, and a CVD apparatus using plasma).

What is claimed is:

1. A substrate processing apparatus comprising:
a process furnace configured to process a substrate;
a boat configured to support a plurality of substrates;
a boat elevator configured to move the boat upward and downward; and
a computer configured to:
control the process furnace for performing a process recipe including a plurality of steps including a boat loading step, a film forming step, and a boat unloading step, and
monitor a progress of each of the plurality of steps of the process recipe,
wherein, when a first time elapsed from a start of the boat loading step exceeds an allowable time previously allocated to the boat loading step while waiting for a completion of the boat loading step in a hold state, and a start of a next step is postponed by the computer, even when a second time for starting the next step lapses during performing the boating loading step, the computer is further configured to:

transmit an alarm message to a memory of the computer so as to report that the allowable time is exceeded, re-perform the boat loading step, and perform another step selected from the plurality of steps different from the boat loading step according to an error of exceeding the allowable time.

2. The substrate processing apparatus of claim 1, wherein the allowable time is different for each of the plurality of steps.

3. The substrate processing apparatus of claim 1, wherein the allowable time is different from a step time for each of the plurality of steps configured when the recipe is prepared.

4. The substrate processing apparatus of claim 1, wherein the computer displays the process recipe including the boat loading step and a cause of the alarm message when the alarm message is received.

5. A substrate processing apparatus comprising:
a process furnace configured to process a substrate;
a boat configured to support a plurality of substrates;
a boat elevator configured to move the boat upward and downward; and
a computer configured to:
control the process furnace for performing a process recipe including a plurality of steps including a boat loading step, a decompression step, a film forming step, a purge step, and a boat unloading step, and
monitor a progress of each of the plurality of steps of the process recipe,
wherein, when a first time elapsed from a start of the decompression step exceeds an allowable time previously allocated to the decompression step while waiting for a completion of the decompression step in a hold state, and a start of a next step is postponed by the computer, even when a second time for starting the next step lapses during performing the decompression step, the computer is further configured to:
transmit an alarm message to a memory of the computer so as to report that the allowable time is exceeded, perform the purge step and the boat unloading step according to an error of exceeding the allowable time, and terminate the process recipe and display a message reporting an abnormal termination.

6. The substrate processing apparatus of claim 1, wherein the computer comprises:
an alarm condition table defining a recovery action executed when the alarm message is generated, and the computer is further configured to execute one recovery action selected from the group consisting of a process of generating a buzzer sound, a process of terminating a recipe, a process of executing an alarm recipe, a process of jumping to a designated step, and a process of operating a device in reset mode.

7. The substrate processing apparatus of claim 6, wherein the computer is further configured to select the recovery action in response to an error occurring in each of the plurality of steps.

8. The substrate processing apparatus of claim 6, wherein the computer is further configured to return to and terminate the process recipe after terminating the alarm recipe.

9. The substrate processing apparatus of claim 1, wherein the computer is further configured to re-perform the one of the plurality of steps during which the alarm message is generated and the next step is performed when the error is cleared.

10. The substrate processing apparatus of claim 1, wherein the computer is further configured to displays icons corresponding to the plurality of steps of the process recipe on a standby monitor screen, and configured to turn on a lamp displayed on the standby monitor screen corresponding to a delayed step and turn off lamps corresponding to other steps including completed steps and the next steps on the standby monitor screen.

11. The substrate processing apparatus of claim 10, wherein the computer is further configured to display at least one of the time elapsed and the allowable time on the standby monitor screen.

12. The substrate processing apparatus of claim 5, wherein the computer comprises an alarm condition table defining a recovery action executed when the alarm message is generated, and the computer is further configured to execute one recovery action selected from the group consisting of a process of generating a buzzer sound, a process of terminating a recipe, a process of executing an alarm recipe, a process of jumping to a designated step, and a process of operating a device in reset mode.

13. The substrate processing apparatus of claim 12, wherein the computer is further configured to select the recovery action in response to an error occurring in each of the plurality of steps.

14. The substrate processing apparatus of claim 12, wherein the computer is further configured to return to and terminate the process recipe after terminating the alarm recipe.

15. The substrate processing apparatus of claim 5, wherein the computer is further configured to display icons corresponding to the plurality of steps of the process recipe on a standby monitor screen, and configured to turn on a lamp displayed on the standby monitor screen corresponding to a delayed step and turn off lamps corresponding to other steps including completed steps and the next steps on the standby monitor screen.

16. The substrate processing apparatus of claim 15, wherein the computer is further configured to display at least one of the time elapsed and the allowable time on the standby monitor screen.

17. A substrate processing apparatus comprising:
a process furnace configured to process a substrate;
a boat configured to support a plurality of substrates;
a boat elevator configured to move the boat upward and downward; and
a computer configured to:
control the process furnace for performing a process recipe including a plurality of steps including a boat loading step, a film forming step, and a boat unloading step, and
monitor a progress of each of the plurality of steps of the process recipe,
wherein, when a first time elapsed from a start of the boat unloading step exceeds an allowable time previously allocated to the boat unloading step while waiting for a completion of the boat unloading step in a hold state, and a start of a next step is postponed by the computer, even when a second time for starting the next step lapses during performing the boat unloading step, the computer is further configured to:
transmit an alarm message to a memory of the computer so as to report that the allowable time is exceeded, re-perform the boat unloading step according to an error of exceeding the allowable time, and terminate the process recipe and display a message reporting an abnormal termination.

* * * * *